(12) United States Patent
Zhang et al.

(10) Patent No.: US 11,729,929 B2
(45) Date of Patent: Aug. 15, 2023

(54) MID-FRAME ASSEMBLY AND DISPLAY DEVICE

(71) Applicant: BOE Technology Group Co., Ltd., Beijing (CN)

(72) Inventors: Shouchuan Zhang, Beijing (CN); Shangchieh Chu, Beijing (CN); Yonghong Zhou, Beijing (CN); Meiling Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/500,765

(22) Filed: Oct. 13, 2021

(65) Prior Publication Data

US 2022/0124923 A1 Apr. 21, 2022

(30) Foreign Application Priority Data

Oct. 15, 2020 (CN) .......................... 202011104616.5

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ... G06F 1/1652; H05K 5/0217; H05K 5/0226
See application file for complete search history.

(56) References Cited

U.S. PATENT DOCUMENTS 10,817,030 B2 * 10/2020 Pelissier ............... G06F 1/1641
2019/0073002 A1 3/2019 Wu et al.
2019/0200470 A1 * 6/2019 Woo ....................... G06F 1/1681
2020/0352044 A1 * 11/2020 Hsu ....................... H05K 5/0247
2022/0155823 A1 * 5/2022 Shin ....................... G06F 1/1624

FOREIGN PATENT DOCUMENTS

| CA | 2582737 A1 | 4/2006 |
| CN | 109979324 A | 7/2019 |
| CN | 110131299 A | 8/2019 |
| CN | 209419660 U | 9/2019 |
| CN | 111223406 A | 6/2020 |
| CN | 111681548 A | 9/2020 |
| CN | 111739421 A | 10/2020 |
| WO | 2006037427 A1 | 4/2006 |

OTHER PUBLICATIONS

CN2020111046165 first office action.

* cited by examiner

*Primary Examiner* — Anthony Q Edwards
*Assistant Examiner* — Bryan Van Huynh
(74) *Attorney, Agent, or Firm* — IPro, PLLC

(57) ABSTRACT

The present disclosure provides a mid-frame assembly. The mid-frame assembly includes: a rotation shaft assembly, a first mid-frame body, a first slide mid-frame, a second mid-frame body, and a second slide mid-frame. The first mid-frame body and the second mid-frame body are rotatably connected to two sides of the rotation shaft assembly; the first slide mid-frame is connected to a side, distal from the rotation shaft assembly, of the first mid-frame body and capable of moving relative to the first mid-frame body; and the second slide mid-frame is connected to a side, distal from the rotation shaft assembly, of the second mid-frame body and capable of moving relative to the second mid-frame body.

20 Claims, 10 Drawing Sheets

MID-FRAME ASSEMBLY AND DISPLAY DEVICE

CROSS-REFERENCE TO RELATED APPLICATION

This application is based on and claims priority to Chinese Patent Application No. 202011104616.5, filed on Oct. 15, 2020 and entitled "MID-FRAME ASSEMBLY AND DISPLAY DEVICE," the disclosure of which is incorporated herein by reference in its entirety.

TECHNICAL FIELD

The present disclosure relates to the field of display technologies, and in particular, relates to a mid-frame assembly and a display device.

BACKGROUND

A bendable display device generally includes a mid-frame assembly and a flexible display panel. The mid-frame assembly is fixed to a side, distal from a display side of the flexible display panel, of the flexible display panel. The flexible display panel has different bending paths from the mid-frame assembly in the case that the bendable display device is folded inwardly (being folded towards the display side) or outwardly (being folded away from the display side). In the case that the display device is folded inwardly, the bending path of the mid-frame assembly is greater than the bending path of the display panel; and in the case that the display device is folded outwardly, the bending path of the mid-frame assembly is shorter than the bending path of the display panel. Thus, where the display panel is fixed on the mid-frame assembly, staggered layers are inevitably caused between the display panel and the mid-frame assembly in the case that the display device is folded, thereby causing the display panel to detach from the mid-frame assembly.

SUMMARY

According to one aspect of embodiments of the present disclosure, a mid-frame assembly is provided. The mid-frame assembly includes: a rotation shaft assembly, a first mid-frame body, a first slide mid-frame, a second mid-frame body, and a second slide mid-frame. The first mid-frame body is rotatably connected to one side of the rotation shaft assembly; the first slide mid-frame is connected to a side, distal from the rotation shaft assembly, of the first mid-frame body, and capable of moving relative to the first mid-frame body along a direction towards or away from the rotation shaft assembly; the second mid-frame body is rotatably connected to the other side of the rotation shaft assembly; and the second slide mid-frame is connected to a side, distal from the rotation shaft assembly, of the second mid-frame body and capable of moving relative to the second mid-frame body along a direction towards or away from the rotation shaft assembly.

In some embodiments, the mid-frame assembly further includes: a first drive assembly, configured to drive the first slide mid-frame to move together during the first mid-frame body is rotated relative to the rotation shaft assembly.

In some embodiments, the first mid-frame body includes a first main mid-frame, and at least one rotation shaft fixedly connected to the first main mid-frame; the rotation shaft is rotatably connected to the rotation shaft assembly; the first drive assembly includes at least one first sub-drive assembly;

wherein the first sub-drive assembly includes: a first linkage gear, wherein the first linkage gear is fixedly connected to and coaxial with the rotation shaft; a second linkage gear, disposed on a side of the first main mid-frame; a drive member, wherein the drive member is connected between the first linkage gear and the second linkage gear, and configured to drive the second linkage gear to rotate under rotation of the first linkage gear; a first gear, wherein the first gear is coaxial with and fixedly connected to the second linkage gear; and a first rack, wherein the first rack is fixed to a side of the first slide mid-frame, and includes a first serrated portion configured to be engaged with the first gear.

In some embodiments, the first mid-frame body includes a first main mid-frame, and at least one rotation shaft fixedly connected to the first main mid-frame; the rotation shaft is rotatably connected to the rotation shaft assembly; the first drive assembly includes at least one first sub-drive assembly;

wherein the first sub-drive assembly includes: a first linkage gear, wherein the first linkage gear is coaxially fitted over the rotation shaft, and fixedly connected to the rotation shaft assembly; a second linkage gear, disposed on a side of the first main mid-frame; a drive member, wherein the drive member is connected between the first linkage gear and the second linkage gear, and configured to drive the second linkage gear to rotate under rotation of the first linkage gear; a first gear, wherein the first gear is coaxial with and fixedly connected to the second linkage gear; and a first rack, wherein the first rack is fixed to a side of the first slide mid-frame, and includes a first serrated portion configured to be engaged with the first gear.

In some embodiments, the first drive assembly further includes: a second gear, the second gear is coaxial with and fixedly connected to the second linkage gear, and an indexing circumference of the second gear is shorter than an indexing circumference of the first gear; and a second rack, fixed to a side of the first slide mid-frame and including a second serrated portion configured to be engaged with the second gear, wherein the second serrated portion is disposed on a side, distal from the rotation shaft assembly, of the first serrated portion, and at a same moment at most one of the first serrated portion and the second serrated portion is in engagement.

In some embodiments, the drive assembly further includes: a first drive gear, disposed on a side of the first main mid-frame; a first gear belt, drive-connected between the first drive gear and the first linkage gear; a second drive gear, wherein the second drive gear is coaxial with and fixedly connected to the first drive gear, and an indexing circumference of the second drive gear is longer than an indexing circumference of the first drive gear; and a second gear belt, drive-connected between the second drive gear and the second linkage gear.

In some embodiments, the first sub-drive assembly further includes: a first support seat, wherein the first support seat is fixedly connected to a side of the first main mid-frame, and provided with a first through hole; a first shaft pin, wherein the first shaft pin is rotatably connected in the first through hole, and coaxial with and fixedly connected to the second linkage gear; a second support seat, wherein the second support seat is fixedly connected to a side of the first main mid-frame, and provided with a second through hole; and a second shaft pin, wherein the second shaft pin is rotatably connected in the second through hole, and coaxial with and fixedly connected to the first drive gear and the second drive gear.

In some embodiments, the first support seat includes: a first support plate, wherein the first support plate is fixedly connected to a side of the first main mid-frame, and provided with a first sub-through hole; and a second support plate, wherein the second support plate is fixedly connected to a side of the first main mid-frame and spaced apart from the first support plate, and provided with a second sub-through hole, wherein the first sub-through hole and the second sub-through hole form the first through hole.

In some embodiments, the second support seat includes: a third support plate, wherein the third support plate is fixedly connected to a side of the first main mid-frame, and provided with a third sub-through hole; and a fourth support plate, wherein the fourth support plate is fixedly connected to a side of the first main mid-frame and spaced apart from the third support plate, and provided with a fourth sub-through hole, wherein the third sub-through hole and the fourth sub-through hole form the second through hole.

In some embodiments, the first mid-frame body further includes: a first baffle, wherein the first baffle is disposed on a side of the first main mid-frame and fixedly connected to the first main mid-frame, and fixedly connected to the first rotation shaft and rotatably connected to the rotation shaft assembly via the rotation shaft.

In some embodiments, the rotation shaft assembly further includes: a rotation shaft body; a first connection portion, wherein the first connection portion is disposed on one end of the rotation shaft body and fixedly connected to the rotation shaft body, and the first connection portion is provided with two third through holes; and a second connection portion, wherein the second connection portion is disposed on the other end of the rotation shaft body and fixedly connected to the rotation shaft body, and the second connection portion is provided with two fourth through holes;

wherein the first mid-frame body is connected to one of the third through holes and one of the fourth through holes; and the second mid-frame body is connected to the other third through hole and the other fourth through hole.

In some embodiments, the first baffle includes: a baffle body, including a first side edge and a second side edge opposite to each other; a first extension portion, connected to the first side edge of the baffle body; and a second extension portion, connected to the second side edge of the baffle body;

wherein the first extension portion and the second extension portion are opposite to each other, and the rotation shaft is disposed between the first extension portion and the second extension portion and is connected to at least one of the first extension portion and the second extension portion.

In some embodiments, the first drive assembly includes two of the first sub-drive assembly.

In some embodiments, the first slide mid-frame includes: a first frame portion, including a first plate body, a first side plate and a second side plate, wherein the first side plate and the second side plate are disposed on a same surface of the first plate body opposite to each other, and connected to the first plate body; a first insertion portion, disposed on a side of the first frame portion and connected to an end of the first side plate; a second insertion portion, disposed on a same side of the first frame portion as the first insertion portion and connected to an end of the second side plate; and the first insertion portion and the second insertion portion are movably connected to the first main mid-frame.

In some embodiments, the first main mid-frame includes: a second frame portion, including a second plate body, a third side plate and a fourth side plate, wherein the third side plate and the fourth side plate are disposed on a same surface of the first plate body opposite to each other, and connected to the second plate body;

wherein the third side plate is provided with a first recess at an end, the fourth side plate is provided with a second recess at an end, the first insertion portion is slidably inserted in the first recess, and the second insertion portion is slidably inserted in the second recess.

In some embodiments, the mid-frame assembly further includes: a second drive assembly, configured to drive the second slide mid-frame to move together in the case that the second mid-frame body is rotated relative to the rotation shaft assembly.

In some embodiments, the second drive assembly is in a same structure with the first drive assembly.

In some embodiments, the second mid-frame body is in a same structure with the first mid-frame body.

In some embodiments, the second slide mid-frame is a same structure with the first slide mid-frame.

According to another aspect of embodiments of the present disclosure, a display device is provided. The display device includes a flexible display panel; and a mid-frame assembly;

wherein the mild-frame assembly includes: a rotation shaft assembly; a first mid-frame body, rotatably connected to one side of the rotation shaft assembly; a first slide mid-frame, wherein the first slide is connected to a side, distal from the rotation shaft assembly, of the first mid-frame body, and capable of moving relative to the first mid-frame body along a direction towards or away from the rotation shaft assembly; a second mid-frame body, rotatably connected to the other side of the rotation shaft assembly; and a second slide mid-frame, wherein the second slide mid-frame is connected to a side, distal from the rotation shaft assembly, of the second mid-frame body, and capable of moving relative to the second mid-frame body along a direction towards or away from the rotation shaft assembly;

wherein a first slide mid-frame of the mid-frame assembly is fixedly connected to one end of the flexible display panel, and a second slide mid-frame of the mid-frame assembly is fixedly connected to the other end of the flexible display panel.

DETAILED DESCRIPTION

Figure 1:
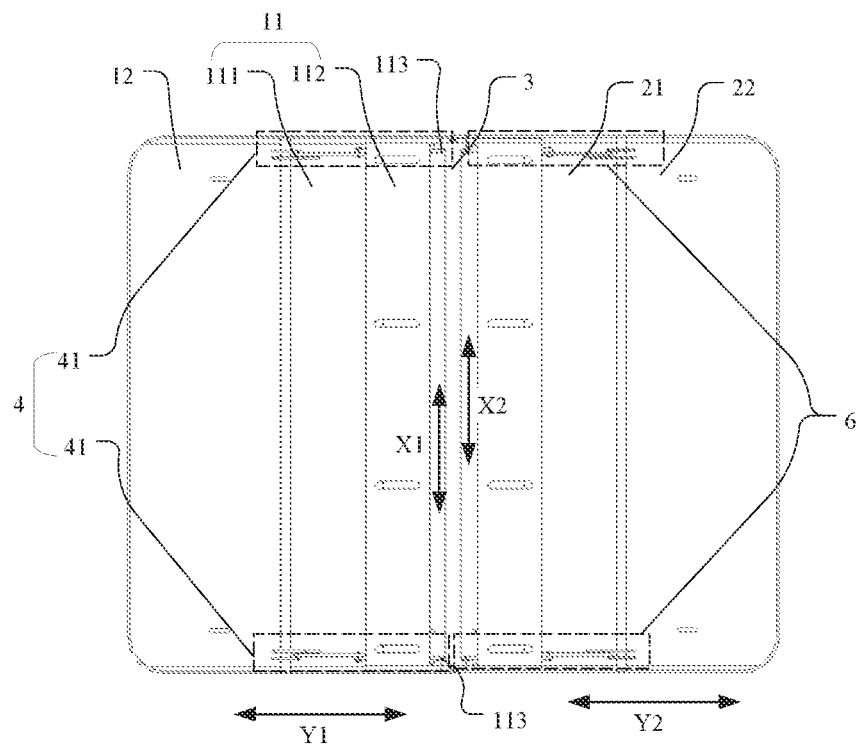
FIG. 1 is a top view of a mid-frame assembly in an unfolded state according to the present disclosure.

Exemplary embodiments are hereinafter described more fully with reference to the accompanying drawings. However, the exemplary embodiments may be implemented in various forms, and shall not be constructed as limited to the embodiments set forth herein. On the contrary, provision of these embodiments may enable the present disclosure to be more comprehensive and complete, and thereby conveying the concept of the exemplary embodiments to those skilled in the art. The same reference signs in the drawings may indicate the same or similar structures, and thus their detailed descriptions are omitted.

Although relative terms such as "up" and "down" are adopted in this specification to describe the relative relationship of one component to another represented by a reference sign, these terms are adopted in this specification only for convenience, for example, based on the direction of the example described in the accompanying drawings. It can be understood that if the device shown by the reference sign is flipped to make it upside down, the component described as being "up" may become the component described as being "down." Other relative terms such as "high," "low," "top," "bottom," "left," and "right" shall also be understood to have the similar meanings. In the case that a structure is "on" other structures, it may mean that a structure is integrally formed on other structures, or that a structure is "directly" provided on other structures, or that a structure is "indirectly" provided on other structures via another structure.

The terms "a," "one," "the" are adopted to indicate the existence of one or more elements or components; and the terms "include" and "have" are adopted to indicate open-ended inclusion and to mean that additional elements or components. may exist besides the listed elements or components.

Figure 3:
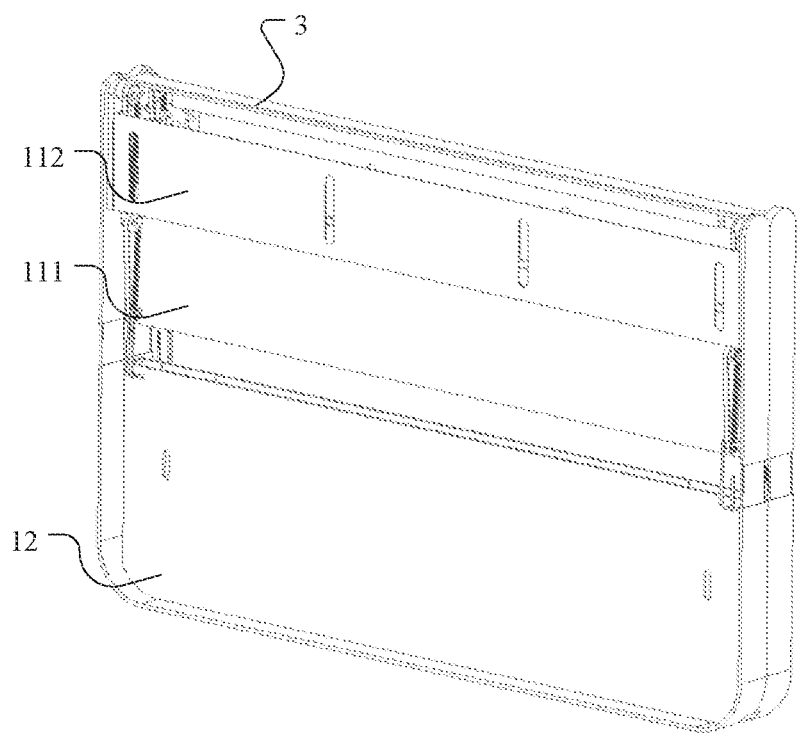
FIG. 3 is a schematic structural diagram of a housing assembly in an inwardly folded state according to the present disclosure.
Figure 4:
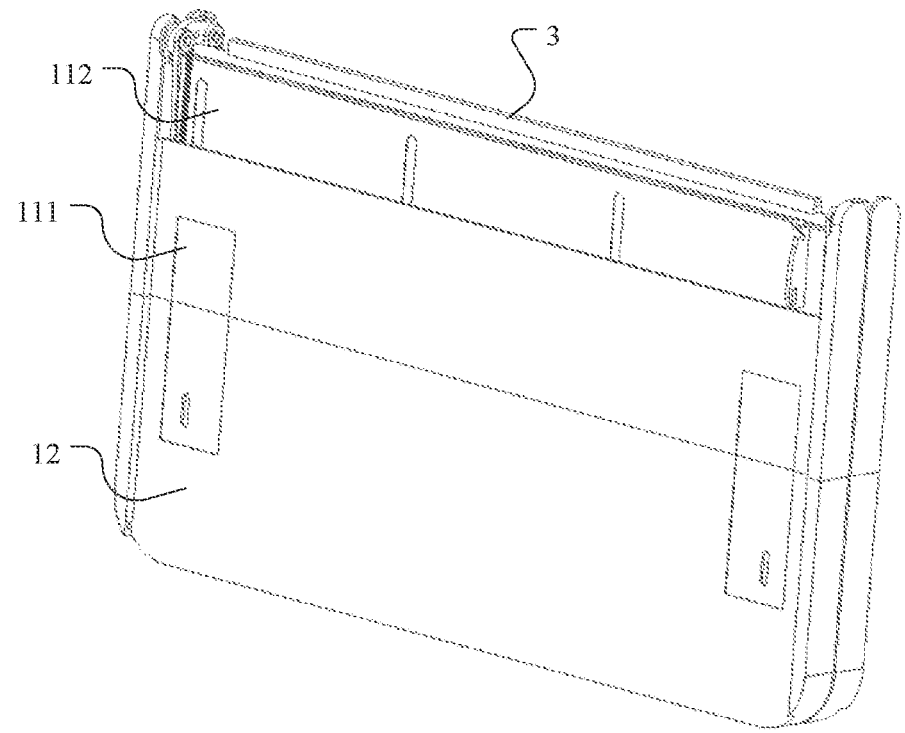
FIG. 4 is a schematic structural diagram of a housing assembly in an outwardly folded state according to the present disclosure.

The present exemplary embodiments provide a mid-frame assembly. As shown in FIG. 1 to FIG. 4, FIG. 1 a top view of a mid-frame assembly in an unfolded state according to the present disclosure; FIG. 2 is an oblique view of a mid-frame assembly in an unfolded state according to the present disclosure; FIG. 3 is a schematic structural diagram of a housing assembly in an inwardly folded state according to the present disclosure; and FIG. 4 is a schematic structural diagram of a housing assembly in an outwardly folded state according to the present disclosure. The mid-frame assembly may include: a rotation shaft assembly 3, a first mid-frame body 11, a first slide mid-frame 12, a second mid-frame body 21, and a second slide mid-frame 22.

The first mid-frame body 11 is rotatably connected to a side of the rotation shaft assembly 3, the first slide mid-frame 12 is configured to be fixedly connected to an end of a flexible panel, and the first slide mid-frame 12 is capable of moving relative to the first mid-frame body 11 along a direction towards or away from the rotation shaft assembly 3.

In some embodiments, a rotation shaft of the first mid-frame body 11 is parallel to a first axial direction X1. The first slide mid-frame 12 is slidingly connected to a side, distal from the rotation shaft assembly 3, of the first mid-frame body 11 along a first direction Y1, and the first direction Y1 is a direction towards or away from the rotation shaft assembly 3. The first direction Y1 is intersected with the first axial direction X1, and for example, may be perpendicular to the first axial direction X1.

The second mid-frame body 21 is connected to a side, distal from the rotation shaft assembly 3, of the second mid-frame body 21, the second slide mid-frame 22 is configured to be fixedly connected the other end of the flexible panel, and the second slide mid-frame 22 is capable of moving relative to the second mid-frame body 21 along a direction towards or away from the rotation shaft assembly 3.

In some embodiments, a rotation shaft of the second mid-frame body 21 is parallel to a second axial direction X2. The second slide mid-frame 22 is slidingly connected to a side, distal from the rotation shaft assembly 3, of the second mid-frame body 21 along a second direction Y2, and the second direction Y2 is a direction towards or away from the rotation shaft assembly 3. The second direction Y2 is intersected with the second axial direction X2, and for example, may be perpendicular to the second axial direction X2.

The first axial direction X1 may be in parallel with the second axial direction X2, and may be perpendicular to the first direction Y1 and the second direction Y2, respectively.

The mid-frame assembly according to the present exemplary embodiments may be configured to fix the flexible panel. In the case that the mid-frame assembly is bent, the size of the mid-frame assembly may be adjusted to compensate for the amount of slippage that occurs during the flexible panel is bent, which can namely avoid the occurrence of staggered layers between the mid-frame assembly and the flexible panel by adjusting the size. For example, during the first mid-frame body 11 is rotated relative to the rotation shaft assembly 3, the first slide mid-frame 12 may slide relative to the first mid-frame body 11 to adjust the size of the mid-frame assembly. Specifically, during the first mid-frame body 11 is rotated towards a side provided with the flexible panel, the first slide mid-frame 12 may slide towards a side distal from the rotation shaft assembly 3 to increase the size of the mid-frame assembly. In the case that the first mid-frame body 11 is rotated to a side distal from the flexible panel, the first slide mid-frame may slide towards to the rotation shaft assembly 3 to reduce the size of the mid-frame assembly. Similarly, during the second mid-frame body is rotated relative to the rotation shaft assembly, the second slide mid-frame may also slide relative to the first mid-frame body to adjust the size of the mid-frame assembly. The mid-frame assembly may compensate for the amount of slippage that occurs during the flexible panel is bent to avoid staggered layers between the flexible panel and the mid-frame assembly. In the case that the flexible panel is a flexible display panel, the flexible display panel is fixedly connected to the mid-frame assembly, such that the mid-frame assembly has no need to be provided with a bezel for accommodating the flexible display panel, thereby realizing the bezel-less display. Further, the first mid-frame body and the second mid-frame body are provided symmetrically on both sides of the rotation shaft assembly, and each of the first mid-frame body and the second mid-frame body may be bent at 90 degrees to achieve folding of the flexible panel, which can obviously reduce the partial bending angle in the case that the flexible panel is folded.

Figure 2:
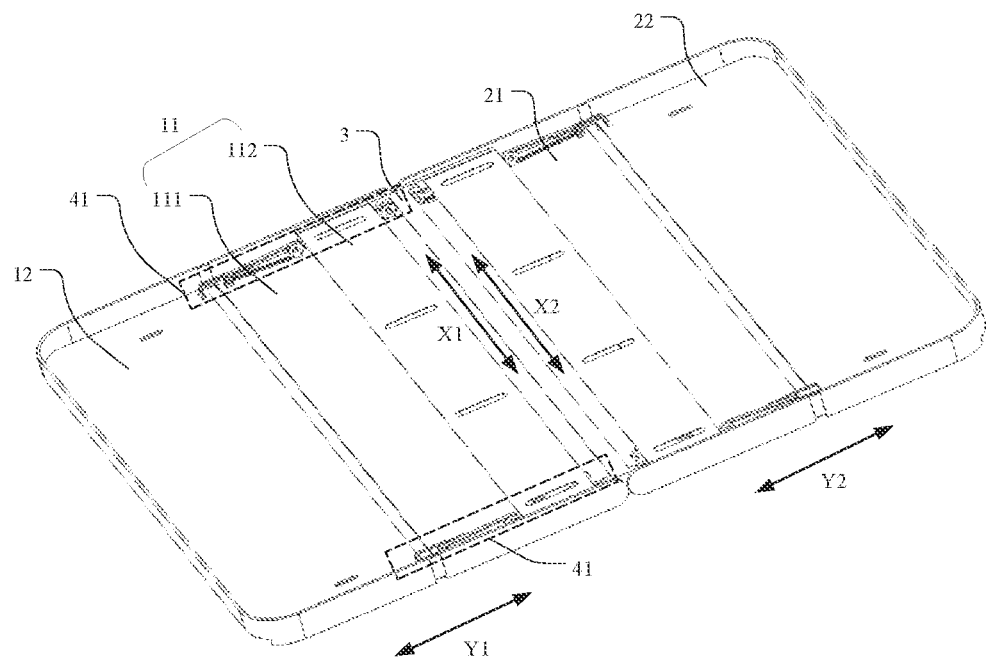
FIG. 2 is an oblique view of a mid-frame assembly in an unfolded state according to the present disclosure.

In the exemplary embodiments, as shown in FIGS. 1 and 2, the mid-frame assembly may further include a first drive assembly 4. The first drive assembly 4 is configured to drive the first slide mid-frame 12 to move together in the case that the first mid-frame body 11 is rotated relative to the rotation shaft assembly 3.

As shown in FIG. 1, the first drive assembly 4 may be connected between the first mid-frame body 11 and the first slide mid-frame 12, and configured to pull the first slide mid-frame 12 to slide along a direction towards or away from the rotation shaft assembly 3 under rotation of the first mid-frame body 11 relative to the rotation shaft assembly 3.

Figure 5:
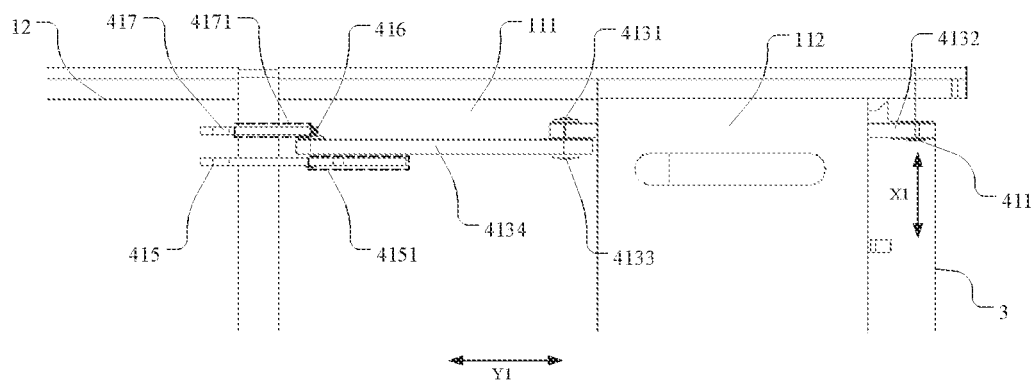
FIG. 5 is an enlarged partial view of a first sub-drive assembly shown in a dashed frame of FIG. 1.
Figure 6:
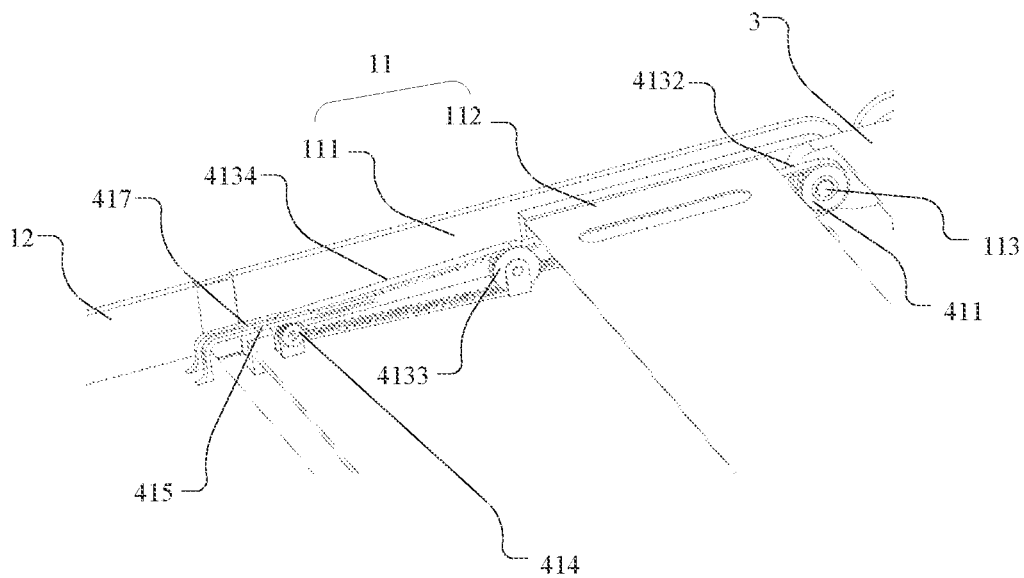
FIG. 6 is an enlarged partial view of a first sub-drive assembly shown in a dashed frame of FIG. 2.
Figure 7:
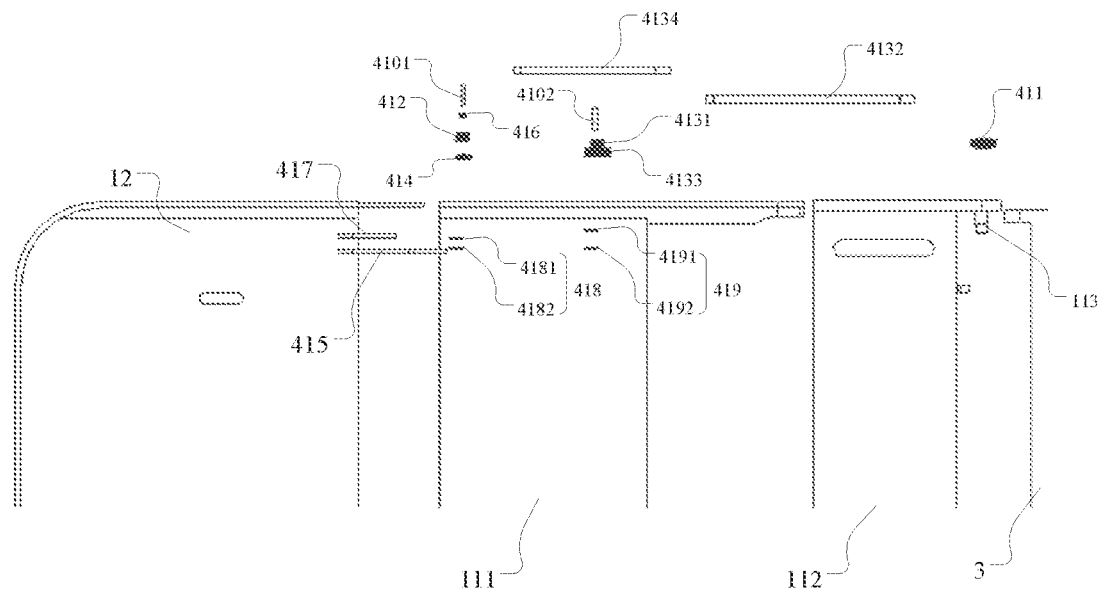
FIG. 7 is a schematic diagram of a partially disassembled structure of a mid-frame assembly according to the present disclosure.

In the exemplary embodiments, as shown in FIGS. 1, 2, 5, 6, and 7, FIG. 5 is an enlarged partial view of a first sub-drive assembly shown in a dashed frame of FIG. 1, FIG. 6 is an enlarged partial view of a first sub-drive assembly shown in a dashed frame of FIG. 2, and FIG. 7 is a schematic diagram of a partially disassembled structure of a mid-frame assembly according to the present disclosure. The first mid-frame body 11 may include a first main mid-frame 111, a first baffle 112, and two rotation shafts 113.

The first baffle 112 is disposed on a side of the first main mid-frame 111, and is fixedly connected to the first main mid-frame 111. For example, the first baffle 112 may be fixedly connected to a side of the first main mid-frame 111 distal from the flexible panel. The first baffle 112 is fixedly connected to the rotation shaft 113, and may be rotatably connected to the rotation shaft assembly 3 via the two rotation shafts 113. The rotation shaft 113 may have a same axial direction as the first axial direction X1.

As shown in FIGS. 5, 6, and 7, the first drive assembly 4 may include two first sub-driving assemblies 41, and the first sub-drive assembly 41 may include a first linkage gear 411, a second linkage gear 412, a drive member, a first gear 414, a first rack 415, a second gear 416, and a second rack 417.

The first linkage gear 411 may be fixedly connected to the rotation shaft 113 and disposed coaxially with the rotation shaft 113. The second linkage gear 412 may be disposed on a side of the first main mid-frame 111 distal from the flexible panel; and the drive member may be connected between the first linkage gear 411 and the second linkage gear 412 for driving the second linkage gear 421 to rotate under the rotation of the first linkage gear 411.

The first gear 414 is coaxial with and fixedly connected with the second linkage gear 412; and the first rack 415 may be fixed to a side of the first slide mid-frame 12 distal from the flexible panel, and may include a first serrated portion 4151 configured to be engaged with the first gear 414.

In some embodiments, the first linkage gear 411 is coaxially fitted over the rotation shaft 113 and is fixedly connected to the rotation shaft assembly 3. In the case that the first mid-frame body 11 and the rotation shaft assembly 3 rotate relative to each other, that is, the first linkage gear 411 may rotate around the rotation shaft 113, the second linkage gear 412 is, via the drive member, driven to rotate.

The second gear 416 may be coaxial with and fixedly connected with the second linkage gear 412, and the second linkage gear 412 may be disposed between the first gear 414 and the second gear 416. The second rack 417 may be fixed to a side of the first slide mid-frame 12 distal from the flexible panel, and may include a second serrated portion 4171 configured to be engaged with the second gear 416. The second serrated portion 4171 may be disposed on a side, distal from the rotation shaft assembly, of the first serrated portion 4151, and at a same moment at most one of the first serrated portion 4151 and the second serrated portion 4171 is in engagement.

The first rack 415 and the second rack 417 may extend along a direction parallel to the first direction Y1. The first rack 415 may be disposed on a side, distal from the first main mid-frame 111, of the first gear 414, and the second rack 417 may be disposed on a side, distal from the first main mid-frame 111, of the second gear 416. The two first sub-driving assemblies 41 may be respectively disposed on both sides of the first mid-frame body 11 or the first slide mid-frame 12 along the first axial direction X1, and the two first sub-driving assemblies 41 may be connected to the two rotation shafts 113, respectively.

In the exemplary embodiments, as shown in FIGS. 5, 6, and 7, the drive member may include: a first drive gear 4131, a first gear belt 4132, a second drive gear 4133, and a second gear belt 4134.

The first drive gear 4131 is disposed on a side of the first main mid-frame 111. For example, the first drive gear 4131 may be disposed on a side of the first main mid-frame 111 distal from the display panel.

The first gear belt 4132 may be drive-connected between the first drive gear 4131 and the first linkage gear 411; the second drive gear 4133 may be coaxial with and fixedly connected with the first drive gear 4131; and the second gear belt 4134 may be drive-connected between the second drive gear 4133 and the second linkage gear 412. An indexing circumference of the second drive gear 4133 is longer than an indexing circumference of the first drive gear 4131. That is, in the case that the second drive gear 4133 turns one revolution, the distance that the first gear belt 4132 moves is less than the distance that the second gear belt 4134 moves. In this way, the driving efficiency from an active gear to a driven gear may be increased, and accordingly, the size of the first gear and the second gear may be reduced in the case that the driving efficiency is constant. It should be understood that the drive member may also be of other structures in other exemplary embodiments. For example, the drive member may include only a gear belt that is drive-connected between the first linkage gear and the second linkage gear, and for another example, the drive member may include a plurality of drive gears.

In the exemplary embodiments, in the case that the mid-frame assembly transitions from the unfolded state shown in FIG. 1 to the inwardly folded state shown in FIG. 3, the first mid-frame body 11, as shown in FIG. 6, rotates (i.e., rotates downward) relative to the rotation shaft assembly 3 towards a side provided with the flexible panel, and the rotation shaft 113 drives the first linkage gear 411 to rotate counterclockwise. In conjunction with FIG. 7, the first linkage gear 411 drives the second linkage gear 412 to rotate counterclockwise, and at a same moment the first serrated portion 4151 of the first rack 415 is engaged with the first gear 414, and the second serrated portion 4171 of the second rack 417 is separated from the second gear 416. The first gear 414 drives the first slide mid-frame 12 to move towards a side distal from the rotation shaft assembly 3 via the first rack 415, thereby increasing the length of the mid-frame assembly.

In the case that the mid-frame assembly transitions from the unfolded state shown in FIG. 1 to the outwardly folded state shown in FIG. 4, the first mid-frame body 11, as shown in FIG. 6, rotates (i.e., rotates upward) relative to the rotation shaft assembly 3 towards a side distal from the flexible panel, and the rotation shaft 113 drives the first linkage gear 411 to rotate clockwise. In conjunction with FIG. 7, the first linkage gear 411 drives the second linkage gear 412 to rotate clockwise, and at a same moment the second serrated portion 4171 of the second rack 417 is engaged with the second gear 416, and the first serrated portion 4151 of the first rack 415 is separated from the first gear 414. The second gear 416 drives the first slide mid-frame 12 to move towards a side distal from the rotation shaft assembly 3 via the second rack 417, thereby reducing the length of the mid-frame assembly.

In the exemplary embodiments, in the case that the mid-frame assembly transitions from the unfolded state shown in FIG. 1 to the inwardly folded state shown in FIG. 3, the amount of slippage required to be compensated by the mid-frame assembly for the flexible panel is S1; and in the case that the mid-frame assembly transitions from the unfolded state shown in FIG. 1 to the outwardly folded state shown in FIG. 4, the amount of slippage required to be compensated by the mid-frame assembly for the flexible panel is S2, wherein S1 is greater than S2. In the present exemplary embodiments, an indexing circumference of the second gear 416 may be shorter than an indexing circumference of the first gear 414. That is, the distance that the second rack 417 moves under the action of the second gear 416 that turns one revolution is less than the distance that the first rack 415 moves under the action of the first gear 414 that turns one revolution. In this way, the mid-frame assembly may have different dimensional changes while being folded inwardly and outwardly, thereby correspondingly compensating different amounts of slippage during the process of inwardly and outwardly folding the flexible panel.

In the exemplary embodiments, all rotation shafts of the second linkage gear 412, the first gear 414, the second gear 416, the first drive gear 4131, and the second drive gear 4133 may be parallel to the first axial direction X1. The first gear belt 4132 and the second gear belt 4134 may both extend along the first direction Y1.

It should be understood that the first drive assembly 4 may further be of other structures in other exemplary embodiments. For example, the first drive assembly 4 may include other numbers of first sub-driving assemblies 41. The first mid-frame body 11 may further be of other structures. For example, the first mid-frame body 11 may merely include the first main mid-frame 111 and the rotation shaft 113 fixedly connected to the first main mid-frame 111, and the first main mid-frame 111 may be rotatably connected to the rotation shaft assembly via the rotation shaft 113 or other rotation shafts disposed coaxially with the rotation shaft 113. The rotation shaft 113 may further be connected to other positions of the first baffle 112. As long as the rotation shaft 113 is in a same axial direction as the first axial direction X1, the rotation shaft 113 may drive, via the first linkage gear 411, the second linkage gear 412 to rotate.

Figure 8:
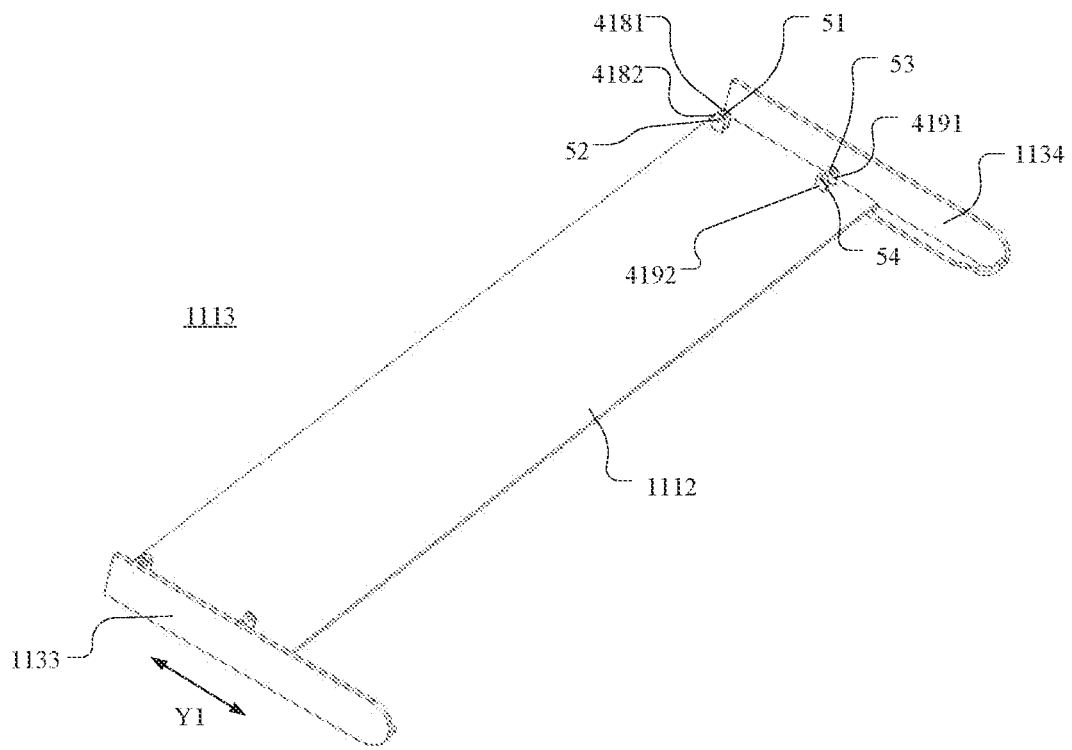
FIG. 8 is a schematic structural diagram of a first main mid-frame in a mid-frame assembly according to some exemplary embodiments of the present disclosure.

As shown in FIG. 7 and FIG. 8, FIG. 8 is a schematic structural diagram of a first main mid-frame in a mid-frame assembly according to some exemplary embodiments of the present disclosure. In the present exemplary embodiments, a specific configurations structure of each gear in the first sub-drive assembly is provided. The first sub-drive assembly may further include a first support seat 418, a first shaft pin 4101, a second support seat 419, and a second shaft pin 4102. The first support seat 418 is fixedly connected to a side of the first main mid-frame 111, and the first support seat 418 is provided with a first through hole. For example, the first support seat 418 may be fixedly connected to a side of the first main mid-frame 111 distal from the display panel.

The first shaft pin 4101 may be rotatably connected in the first through hole, and may be coaxial with and fixedly connected with the second linkage gear 42, the first gear 414, and the second gear 416. The second support seat 419 may be fixedly connected to a side of the first main mid-frame 111 distal from the display panel, and is provided with a second through hole. The second shaft pin 4102 is rotatably connected in the second through hole, and is coaxial with and fixedly connected to the first drive gear 4131 and the second drive gear 4133. The axial directions of the first shaft pin 4101 and the second shaft pin 4102 may be parallel to the first axial direction X1.

In the exemplary embodiments, as shown in FIG. 7 and FIG. 8, the first support seat 418 may include a first support plate 4181 and a second support plate 4182. The first support plate 418 is fixedly connected to a side of the first main mid-frame 111, and the second support plate 4182 is fixedly connected to a side of the first main mid-frame 111 and spaced apart from the first support plate 4181.

In some embodiments, the first support plate 4181 is fixedly connected to a side of the first main mid-frame 111 distal from the display panel, and is provided with a first sub-through hole 51. The second support plate 4182 is fixedly connected to a side of the first main mid-frame 111 distal from the display panel, and is spaced apart from the first support plate 4181 in the axial direction of the first axial pin 4101. The second support plate 4182 is provided with a second sub-through hole 52, the first sub-through hole 51 and the second sub-through hole 52 are coaxial and form a first through hole, and two ends of the first shaft pin 4101 are disposed in the first sub-through hole 51 and the second sub-through hole 52, respectively.

The second support seat may include a third support plate 4191 and a fourth support plate 4192. The third support plate 4191 is fixedly connected to a side of the first main mid-frame 111, and the fourth support plate 4192 is fixedly connected to a side of the first main mid-frame 111 and spaced apart from the third support plate 4191.

In some embodiments, the third support plate 4191 is fixedly connected to a side of the first main mid-frame 111 distal from the display panel, and is provided with a third sub-through hole 53. The fourth support plate 4192 is fixedly connected to a side of the first main mid-frame 111 distal from the display panel, and spaced apart from the third support plate 4191 in the axial direction of the second shaft pin 4102. The fourth support plate 4192 is provided with a fourth sub-through hole 54 that is coaxially provided with the third sub-through hole 53, and the third sub-through hole 53 and the fourth sub-through hole 54 form the second through hole. Two ends of the second shaft pin 4102 are disposed in the third sub-through hole 53 and the fourth sub-through hole 54, respectively.

Figure 9:
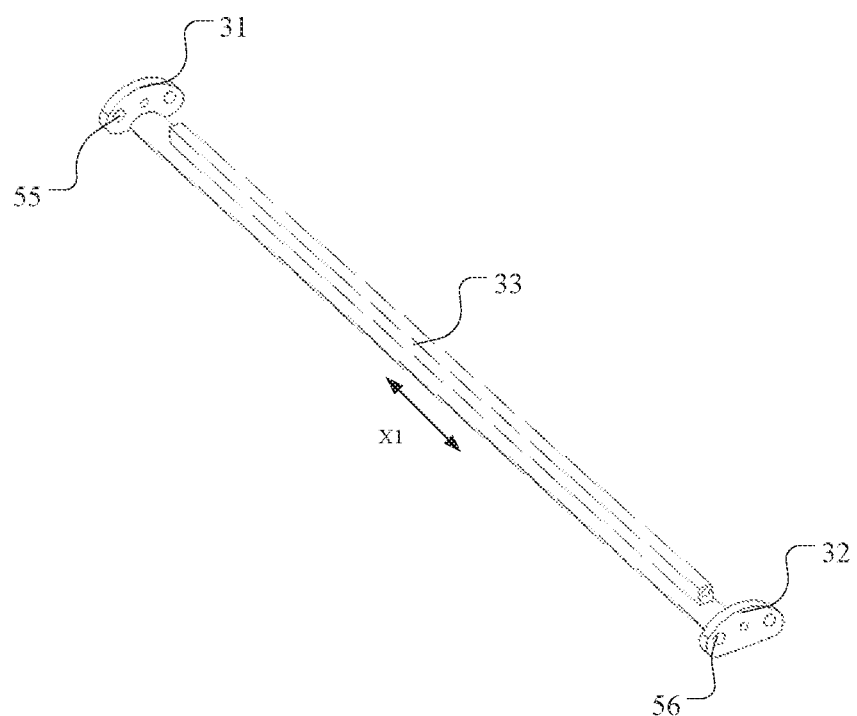
FIG. 9 is a schematic structural diagram of a rotation shaft assembly in a mid-frame assembly according to some exemplary embodiments of the present disclosure.
Figure 10:
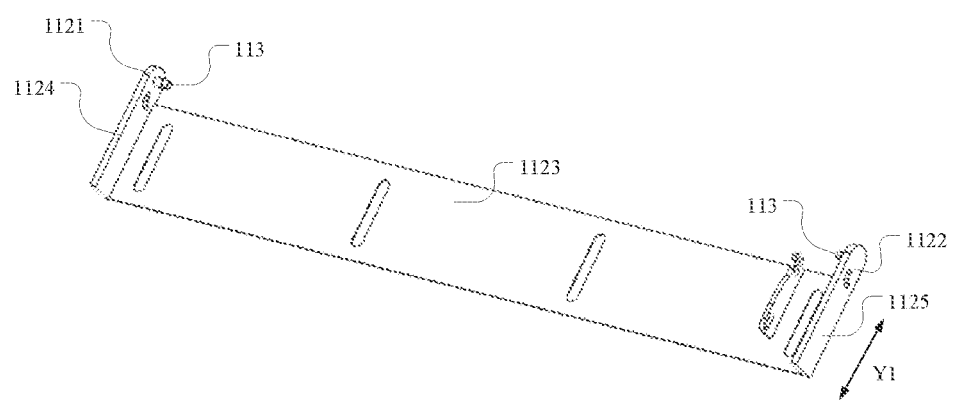
FIG. 10 is a schematic structural diagram of a first baffle in a mid-frame assembly according to some exemplary embodiments of the present disclosure.

In the exemplary embodiments, as shown in FIG. 9 and FIG. 10, FIG. 9 is a schematic structural diagram of a rotation shaft assembly in a mid-frame assembly according to some exemplary embodiments of the present disclosure, and FIG. 10 is a schematic structural diagram of a first baffle in a mid-frame assembly according to some exemplary embodiments of the present disclosure. The rotation shaft assembly 3 may include a rotation shaft body 33, a first connection portion 31, and a second connection portion 32. The first connection portion 31 is disposed at one end of the rotation shaft body 33, and is fixedly connected to the rotation shaft body 33. The second connection portion 32 is disposed at the other end of the rotation shaft body 33, and is fixedly connected to the rotation shaft body 33.

In some embodiments, the rotation shaft body 33 extends along a direction parallel to the first axial direction X1. The first connection portion 31 may be fixedly connected to one end of the rotation shaft body 33 along the extending direction, and is provided with a third through hole 55. The second connection portion 32 is fixedly connected to the other end of the rotation shaft body along the extending direction, and is provided with a fourth through hole 56. In the embodiments of the present disclosure, the first connection portion 31 has two third through holes 55, and the second connection portion 32 has two fourth through holes 56. The first connection portion 31 and the second connection portion 32 are configured to connect with the first mid-frame body 11 and the second mid-frame body 21.

The first baffle 112 may include: a baffle body 1123, a first extension portion 1121, and a second extension portion 1122. The baffle body 1123 has a first side edge 1124 and a second side edge 1125 opposite to each other. The first extension portion 1121 and the second extension portion 1122 are provided opposite to each other. The first extension portion 1121 is connected to the first side edge 1124 of the baffle body 1123, and the second extension portion 1122 is connected to the second side edge 1125 of the baffle body 1123.

In some embodiments, the first extension portion 1121 extends along the first direction Y1, and is connected to the first side edge 1124 of the baffle body; and the second extension portion 1122 extends along the first direction Y1, and is connected to the second side edge 1125 of the baffle body.

The rotation shaft 113 is disposed between the first extension portion 1121 and the second extension portion 1122, and is connected to at least one of the first extension portion 1121 and the second extension portion 1122.

In some embodiments, there are two rotation shafts 113 that are provided coaxially, one of which is connected to the first extension portion 1121 and the other is connected to the second extension portion 1122. The first extension portion 1121 is rotatably mounted in the third through hole 55 via the rotation shaft 113 connected thereto, and the second extension portion 1122 is rotatably mounted in the fourth through hole 56 via the rotation shaft 113 connected thereto.

The first baffle 112 may be configured to support other mechanical structures in the bendable display device.

Figure 11:
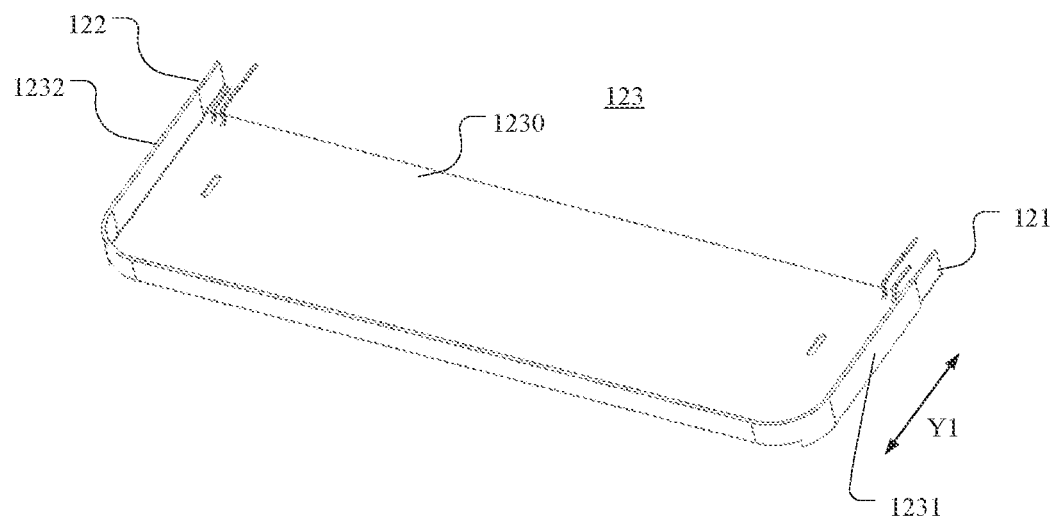
FIG. 11 is a schematic structural diagram of a first slide mid-frame in a mid-frame assembly according to some exemplary embodiments of the present disclosure.

In the exemplary embodiments, as shown in FIG. 11, FIG. 11 is a schematic structural diagram of a first slide mid-frame in a mid-frame assembly according to some exemplary embodiments of the present disclosure. The first slide mid-frame 12 may include a first frame portion 123, a first insertion portion 121, and a second insertion portion 122.

The first frame portion 123 includes a first plate body 1230, a first side plate 1231 and a second side plate 1232. The first side plate 1231 and the second side plate 1232 are disposed on a same surface of the first plate body 1230 opposite to each other, and respectively connected to the first plate body 1230. The first insertion portion 121 is disposed on a side of the first frame portion 123 and connected to an end of the first side plate 1231. The first insertion portion 121 and the second insertion portion 122 are disposed on a same side of the first frame portion 123, and connected to an end of the second side plate. The first insertion portion 121 and the second insertion portion 122 are movably connected to the first main mid-frame 111.

In some embodiments, the first frame portion 123 includes a first side plate 1231 and a second side plate 1232 that are disposed opposite to each other and extend along the first direction Y1. The first insertion portion 121 is connected to the first side plate 1231 and extends along the first direction Y1, and the second insertion portion 122 is connected to the second side plate 1232 and extends along the first direction Y1.

As shown in FIG. 8, the first main mid-frame 111 may include a second frame portion 1113. The second frame portion 1113 includes a second plate body 1112, a third side plate 1133, and a fourth side plate 1134. The third side plate 1133 and the fourth side plate 1134 are disposed on a same surface of the first plate body 1230 opposite to each other, and respectively connected to the second plate body 1112. The third side plate 1133 is provided with a first recess at an end, the fourth side plate 1134 is provided with a second recess at an end, the first insertion portion 121 is slidably inserted in the first recess, and the second insertion portion 122 is slidably inserted in the second recess.

In some embodiments, the second frame portion 1113 may include a third side plate 1133 and a fourth side plate 1134 that are disposed opposite to each other and extend along the first direction Y1. The third side plate 1133 is provided with a first recess extending along the first direction Y1, and the fourth side plate 1134 is provided with a second recess extending along the first direction Y1.

Figure 12:
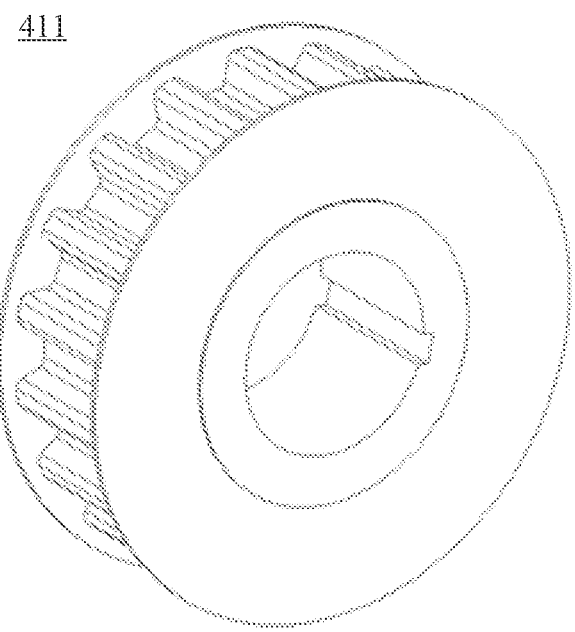
FIG. 12 is a schematic structural diagram of a first linkage gear in a mid-frame assembly according to some exemplary embodiments of the present disclosure.
Figure 13:
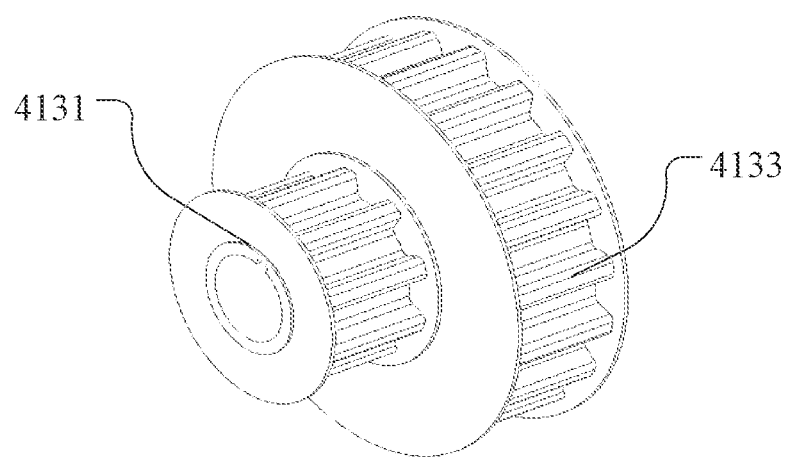
FIG. 13 is a schematic structural diagram of a first drive gear and a second drive gear in a mid-frame assembly according to some exemplary embodiments of the present disclosure.
Figure 14:
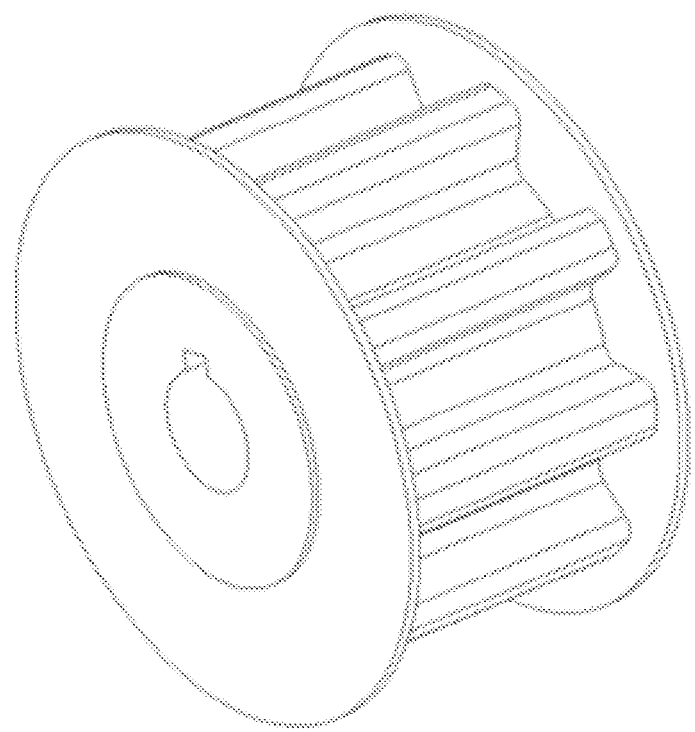
FIG. 14 is a schematic structural diagram of a second linkage gear in a mid-frame assembly according to some exemplary embodiments of the present disclosure.
Figure 15:
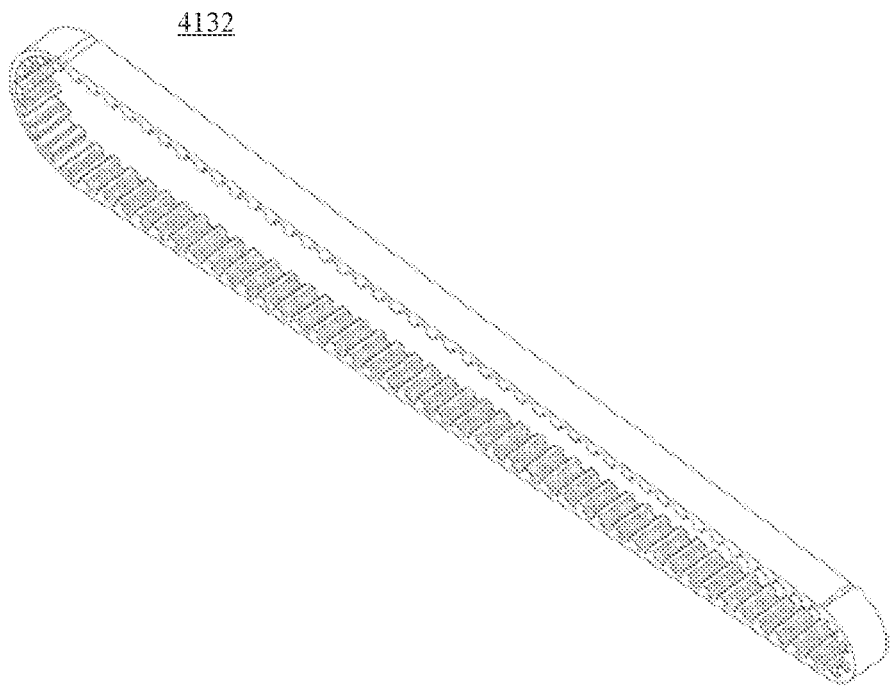
FIG. 15 is a schematic structural diagram of a first gear belt in a mid-frame assembly according to some exemplary embodiments of the present disclosure.
Figure 16:
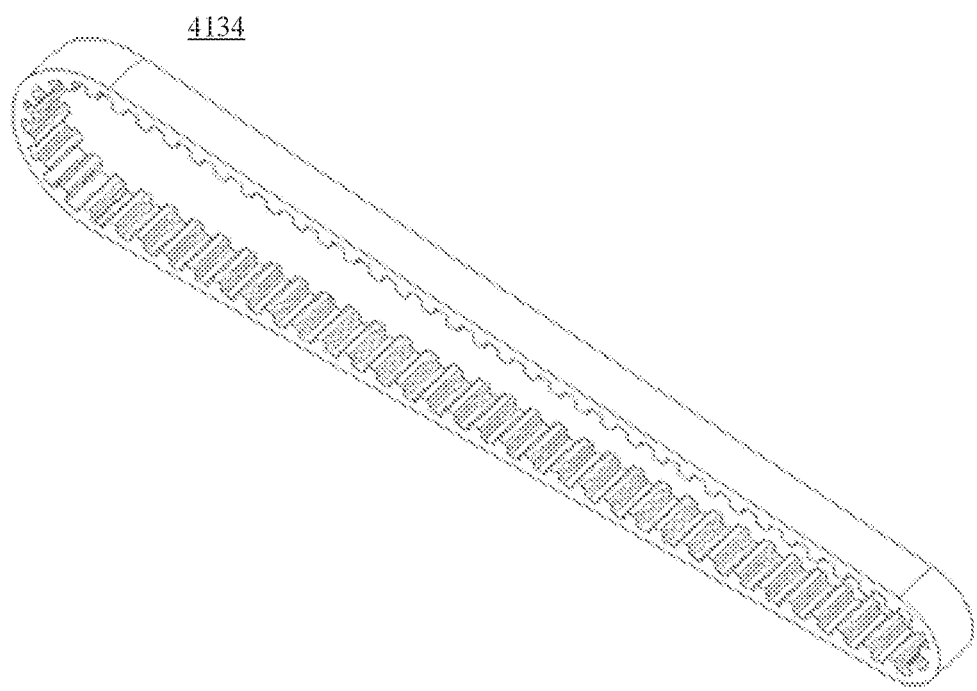
FIG. 16 is a schematic structural diagram of a second gear belt in a mid-frame assembly according to some exemplary embodiments of the present disclosure.
Figure 17:
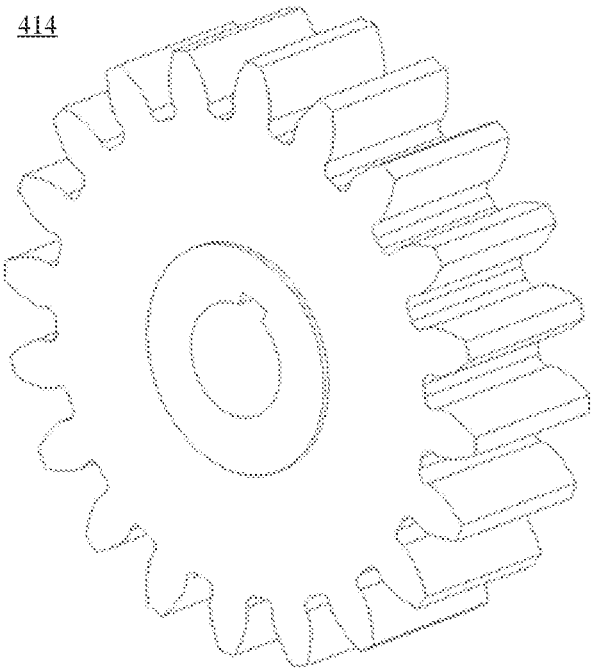
FIG. 17 is a schematic structural diagram of a first gear in a mid-frame assembly according to some exemplary embodiments of the present disclosure.
Figure 18:
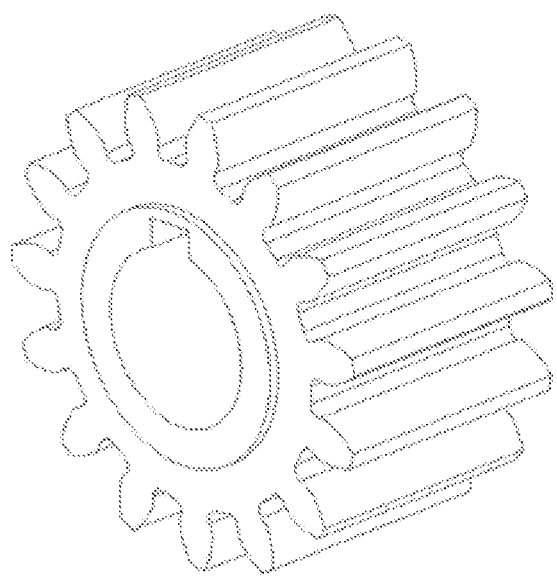
FIG. 18 is a schematic structural diagram of a second gear in a mid-frame assembly according to some exemplary embodiments of the present disclosure.

As shown in FIG. 12 to FIG. 18, FIG. 12 is a schematic structural diagram of a first linkage gear in a mid-frame assembly according to some exemplary embodiments of the present disclosure, FIG. 13 is a schematic structural diagram of a first drive gear and a second drive gear in a mid-frame assembly according to some exemplary embodiments of the present disclosure, and FIG. 14 is a schematic structural diagram of a second linkage gear in a mid-frame assembly according to some exemplary embodiments of the present disclosure. FIG. 15 is a schematic structural diagram of a first gear belt in a mid-frame assembly according to some exemplary embodiments of the present disclosure, FIG. 16 is a schematic structural diagram of a second gear belt in a mid-frame assembly according to some exemplary embodiments of the present disclosure, FIG. 17 is a schematic structural diagram of a first gear in a mid-frame assembly according to some exemplary embodiments of the present disclosure, and FIG. 18 is a schematic structural diagram of a second gear in a mid-frame assembly according to some exemplary embodiments of the present disclosure. In FIG. 13, the indexing circumference of the second drive gear 4133 may be longer than the indexing circumference of the first drive gear 4131. As shown in FIG. 12 to FIG. 14, the first linkage gear 411, the second linkage gear 412, the first drive gear 4131, and the second drive gear 4133 are all provided with axial through holes. The first linkage gear 411 is fixedly connected to the rotation shaft 113 via its axial through hole; the second linkage gear 412 is fixedly connected to the first shaft pin 4101 via its axial through hole; and the first drive gear 4131 and the second drive gear 4133 are fixedly connected to the second shaft pin 4102 via their axial through holes. Both the first gear belt 4132 and the second gear belt 4134 are provided with a serrated structure configured to be engaged with the gears.

In the exemplary embodiments, as shown in FIG. 1 and FIG. 2, the mid-frame assembly may further include a second drive assembly 6. The second drive assembly 6 is configured to drive the second slide mid-frame 22 to move together in the case that the second mid-frame body 21 is rotated relative to the rotation shaft assembly 3.

In some embodiments, the second drive assembly 6 may be connected between the second mid-frame body 21 and the second slide mid-frame 22, and configured to pull the second slide mid-frame 22 to slide along a direction towards or away from the rotation shaft assembly 3 under rotation of the second mid-frame body 21 relative to the rotation shaft assembly 3.

In the exemplary embodiments, the first mid-frame body 11 and the second mid-frame body 21 may have the same structure, and may be symmetrically provided on both sides of the rotation shaft assembly 3. The first slide mid-frame 12 and the second slide mid-frame 22 may have the same structure, and may be symmetrically provided on both sides of the rotation shaft assembly 3. The first drive assembly 4 and the second drive assembly 6 may have the same structure, and may be symmetrically provided on both sides of the rotation shaft assembly 3.

Figure 19:
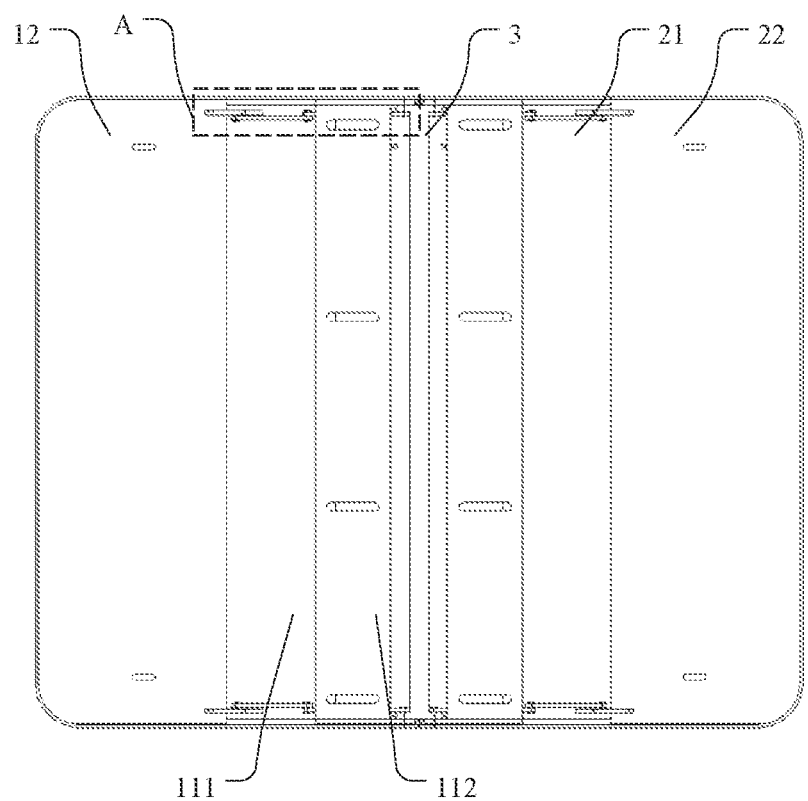
FIG. 19 is a top view of a mid-frame assembly in an unfolded state for a mid-frame assembly according to some exemplary embodiments of the present disclosure.
Figure 20:
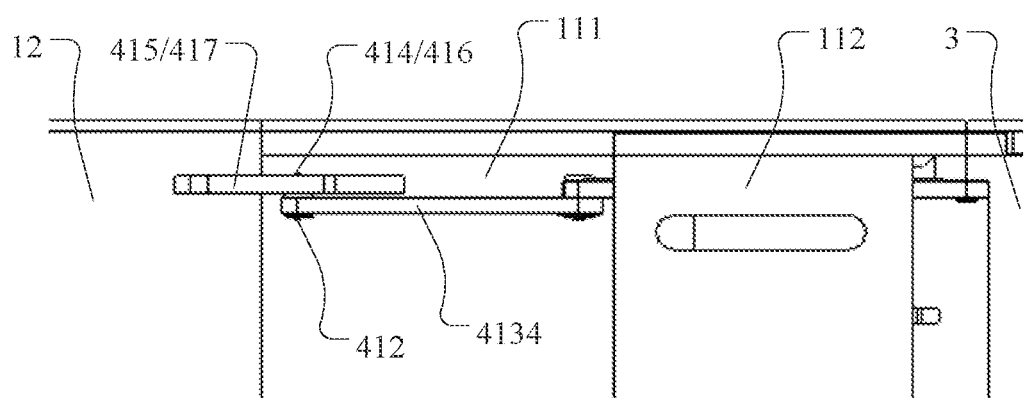
FIG. 20 is an enlarged partial view of a dashed frame A in FIG. 19.

As shown in FIG. 19 and FIG. 20, FIG. 19 is a top view of a mid-frame assembly in an unfolded state for a mid-frame assembly according to another exemplary embodiment of the present disclosure; and FIG. 20 is an enlarged partial view of a dashed frame A in FIG. 19. The mid-frame assembly and the mid-frame assembly shown in FIG. 1 to FIG. 18 may have a similar structure, and difference between the mid-frame assembly and the mid-frame assembly shown in FIG. 1 to FIG. 18 may merely lie in that the first sub-drive assembly of the mid-frame assembly is provided with only the first gear 414 and the first rack 415 or the second gear 416 and the second rack 417. In the case that the mid-frame assembly is provided with only the first gear 414 and the first rack 415, the mid-frame assembly may achieve compensation for the amount of slippage during folding the flexible panel inwardly; and in the case that the mid-frame assembly is provided with only the second gear 416 and the second rack 417, the mid-frame assembly may achieve the compensation for the amount of slippage during folding the flexible panel outwardly.

An exemplary embodiment of the present disclosure further provides a display device. The display device may include the mid-frame assembly described above and a flexible display panel. A first slide mid-frame of the mid-frame assembly is fixedly connected to one end of the flexible display panel, and a second slide mid-frame of the mid-frame assembly is fixedly connected to the other end of the flexible display panel. The display device may be a foldable phone, foldable tablet PC, or the like.

Other embodiments of the present disclosure will be apparent to those skilled in the art from consideration of the specification and practice of the present disclosure. The present disclosure is intended to cover any variations, uses, or adaptation changes of the present disclosure following the general principles thereof and including common knowledge or commonly used technical measures which are not disclosed herein. The specification and the embodiments are to be considered as exemplary only, and the true scope and spirit of the present disclosure are indicated by the following claims.

It should be understood that the present disclosure is not limited to the exact construction that has been described above and illustrated in the accompanying drawings, and that various modifications and changes can be made without departing from the scope thereof. The scope of the present disclosure is only limited by the appended claims.

What is claimed is:

1. A mid-frame assembly, comprising:
a rotation shaft assembly;
a first mid-frame body, rotatably connected to one side of the rotation shaft assembly;
a first slide mid-frame, wherein the first slide mid-frame is connected to a side, distal from the rotation shaft assembly, of the first mid-frame body, and capable of moving relative to the first mid-frame body along a direction towards or away from the rotation shaft assembly;
a second mid-frame body, rotatably connected to the other side of the rotation shaft assembly;
a second slide mid-frame, wherein the second slide mid-frame is connected to a side, distal from the rotation shaft assembly, of the second mid-frame body, and capable of moving relative to the second mid-frame body along a direction towards or away from the rotation shaft assembly; and
a first drive assembly, configured to drive the first slide mid-frame to move together in the case that the first mid-frame body is rotated relative to the rotation shaft assembly;
wherein the first mid-frame body comprises a first main mid-frame, and at least one rotation shaft fixedly connected to the first main mid-frame; the rotation shaft is rotatably connected to the rotation shaft assembly; the first drive assembly comprises at least one first sub-drive assembly, wherein the first sub-drive assembly comprises:
a first linkage gear, wherein the first linkage gear is configured in one of the following ways: the first linkage gear is fixedly connected to the rotation shaft and coaxial with the rotation shaft, and, the first linkage gear is coaxially fitted over the rotation shaft and fixedly connected to the rotation shaft assembly;
a second linkage gear, disposed on a side of the first main mid-frame;
a drive member, wherein the drive member is connected between the first linkage gear and the second linkage gear, and configured to drive the second linkage gear to rotate under rotation of the first linkage gear;
a first gear, wherein the first gear is coaxial with and fixedly connected to the second linkage gear; and
a first rack, wherein the first rack is fixed to a side of the first slide mid-frame, and comprises a first serrated portion configured to be engaged with the first gear.

2. The mid-frame assembly according to claim 1, wherein the first drive assembly further comprises:

a second gear, wherein second gear is coaxial with and fixedly connected to the second linkage gear, and an indexing circumference of the second gear is shorter than an indexing circumference of the first gear; and a second rack, wherein the second rack is fixed to a side of the first slide mid-frame and comprising a second serrated portion configured to be engaged with the second gear, wherein the second serrated portion is disposed on a side, distal from the rotation shaft assembly, of the first serrated portion, and at a same moment at most one of the first serrated portion and the second serrated portion is in engagement.

3. The mid-frame assembly according to claim 2, wherein the drive member comprises:

a first drive gear, disposed on a side of the first main mid-frame;

a first gear belt, drive-connected between the first drive gear and the first linkage gear;

a second drive gear, wherein the second drive gear is coaxial with and fixedly connected to the first drive gear, and an indexing circumference of the second drive gear is longer than an indexing circumference of the first drive gear; and a second gear belt, drive-connected between the second drive gear and the second linkage gear.

4. The mid-frame assembly according to claim 3, wherein the first sub-drive assembly further comprises:

a first support seat, wherein the first support seat is fixedly connected to a side of the first main mid-frame, and is provided with a first through hole;

a first shaft pin, wherein the first shaft pin is rotatably connected in the first through hole, and coaxial with and fixedly connected to the second linkage gear;

a second support seat, wherein the second support seat is fixedly connected to a side of the first main mid-frame, and provided with a second through hole; and a second shaft pin, wherein the second shaft pin is rotatably connected in the second through hole, and coaxial with and fixedly connected to the first drive gear and the second drive gear.

5. The mid-frame assembly according to claim 4, wherein the first support seat comprises:

a first support plate, wherein the first support plate is fixedly connected to a side of the first main mid-frame, and is provided with a first sub-through hole; and a second support plate, wherein the second support plate is fixedly connected to a side of the first main mid-frame and spaced apart from the first support plate, and provided with a second sub-through hole, wherein the first sub-through hole and the second sub-through hole form the first through hole.

6. The mid-frame assembly according to claim 4, wherein the second support seat comprises:

a third support plate, wherein the third support plate is fixedly connected to a side of the first main mid-frame, and is provided with a third sub-through hole; and a fourth support plate, wherein the fourth support plate is fixedly connected to a side of the first main mid-frame and spaced apart from the third support plate, and provided with a fourth sub-through hole, wherein the third sub-through hole and the fourth sub-through hole form the second through hole.

7. The mid-frame assembly according to claim 1, wherein the first mid-frame body further comprises:

a first baffle, wherein the first baffle is disposed on a side of the first main mid-frame and fixedly connected to the first main mid-frame, and fixedly connected to the rotation shaft and rotatably connected to the rotation shaft assembly via the rotation shaft.

8. The mid-frame assembly according to claim 7, wherein the rotation shaft assembly comprises:

a rotation shaft body;

a first connection portion, wherein the first connection portion is disposed on one end of the rotation shaft body and fixedly connected to the rotation shaft body, and the first connection portion is provided with two third through holes; and a second connection portion, wherein the second connection portion is disposed on the other end of the rotation shaft body and is fixedly connected to the rotation shaft body, and the second connection portion is provided with two fourth through holes;

wherein the first mid-frame body is connected to one of the third through holes and one of the fourth through holes; and the second mid-frame body is connected to the other third through hole and the other fourth through hole.

9. The mid-frame assembly according to claim 8, wherein the first baffle comprises:

a baffle body, comprising a first side edge and a second side edge opposite to each other;

a first extension portion, connected to the first side edge of the baffle body; and a second extension portion, connected to the second side edge of the baffle body;

wherein the first extension portion and the second extension portion are opposite to each other, and the rotation shaft is disposed between the first extension portion and the second extension portion and is connected to at least one of the first extension portion and the second extension portion.

10. The mid-frame assembly according to claim 9, wherein the first drive assembly comprises two of the first sub-drive assembly.

11. The mid-frame assembly according to claim 1, wherein the first slide mid-frame comprises:

a first frame portion, comprising a first plate body, a first side plate and a second side plate, wherein the first side plate and the second side plate are disposed on a same surface of the first plate body opposite to each other, and are connected to the first plate body;

a first insertion portion, disposed on a side of the first frame portion and connected to an end of the first side plate; and a second insertion portion, disposed on a same side of the first frame portion as the first insertion portion and connected to an end of the second side plate;

wherein the first insertion portion and the second insertion portion are movably connected to the first main mid-frame.

12. The mid-frame assembly according to claim 11, wherein the first main mid-frame comprises:

a second frame portion, comprising a second plate body, a third side plate and a fourth side plate, wherein the third side plate and the fourth side plate are disposed on a same surface of the first plate body opposite to each other, and connected to the second plate body, respectively;

wherein the third side plate is provided with a first recess at an end, and the fourth side plate is provided with a second recess at an end, wherein the first insertion portion is slidably inserted in the first recess, and the second insertion portion is slidably inserted in the second recess.

13. The mid-frame assembly according to claim 1, wherein the mid-frame assembly further comprises:
a second drive assembly, configured to drive the second slide mid-frame to move together in the case that the second mid-frame body is rotated relative to the rotation shaft assembly.

14. The mid-frame assembly according to claim 13, wherein the second drive assembly is in a same structure with the first drive assembly.

15. The mid-frame assembly according to claim 1, wherein the second mid-frame body is in a same structure with the first mid-frame body.

16. The mid-frame assembly according to claim 1, wherein the second slide mid-frame is in a same structure with the first slide mid-frame.

17. A display device, comprising:
a flexible display panel; and
a mid-frame assembly, comprising:
a rotation shaft assembly;
a first mid-frame body, rotatably connected to one side of the rotation shaft assembly;
a first slide mid-frame, wherein the first slide mid-frame is connected to a side, distal from the rotation shaft assembly, of the first mid-frame body, and capable of moving relative to the first mid-frame body along a direction towards or away from the rotation shaft assembly;
a second mid-frame body, rotatably connected to the other side of the rotation shaft assembly;
a second slide mid-frame, wherein the second slide mid-frame is connected to a side, distal from the rotation shaft assembly, of the second mid-frame body, and capable of moving relative to the second mid-frame body along a direction towards or away from the rotation shaft assembly; and
a first drive assembly, configured to drive the first slide mid-frame to move together in the case that the first mid-frame body is rotated relative to the rotation shaft assembly;
wherein a first slide mid-frame of the mid-frame assembly is fixedly connected to one end of the flexible display panel, and a second slide mid-frame of the mid-frame assembly is fixedly connected to the other end of the flexible display panel; the first mid-frame body comprises a first main mid-frame, and at least one rotation shaft fixedly connected to the first main mid-frame; the rotation shaft is rotatably connected to the rotation shaft assembly; the first drive assembly comprises at least one first sub-drive assembly, wherein the first sub-drive assembly comprises:
a first linkage gear, wherein the first linkage gear is configured in one of the following ways: the first linkage gear is fixedly connected to the rotation shaft and coaxial with the rotation shaft, and, the first linkage gear is coaxially fitted over the rotation shaft and fixedly connected to the rotation shaft assembly;
a second linkage gear, disposed on a side of the first main mid-frame;
a drive member, wherein the drive member is connected between the first linkage gear and the second linkage gear, and configured to drive the second linkage gear to rotate under rotation of the first linkage gear;
a first gear, wherein the first gear is coaxial with and fixedly connected to the second linkage gear; and
a first rack, wherein the first rack is fixed to a side of the first slide mid-frame, and comprises a first serrated portion configured to be engaged with the first gear.

18. The display device according to claim 17, wherein the first drive assembly further comprises:
a second gear, wherein second gear is coaxial with and fixedly connected to the second linkage gear, and an indexing circumference of the second gear is shorter than an indexing circumference of the first gear; and
a second rack, wherein the second rack is fixed to a side of the first slide mid-frame and comprising a second serrated portion configured to be engaged with the second gear, wherein the second serrated portion is disposed on a side, distal from the rotation shaft assembly, of the first serrated portion, and at a same moment at most one of the first serrated portion and the second serrated portion is in engagement.

19. The display device according to claim 18, wherein the drive member comprises:
a first drive gear, disposed on a side of the first main mid-frame;
a first gear belt, drive-connected between the first drive gear and the first linkage gear;
a second drive gear, wherein the second drive gear is coaxial with and fixedly connected to the first drive gear, and an indexing circumference of the second drive gear is longer than an indexing circumference of the first drive gear; and
a second gear belt, drive-connected between the second drive gear and the second linkage gear.

20. The display device according to claim 19, wherein the first sub-drive assembly further comprises:
a first support seat, wherein the first support seat is fixedly connected to a side of the first main mid-frame, and is provided with a first through hole;
a first shaft pin, wherein the first shaft pin is rotatably connected in the first through hole, and coaxial with and fixedly connected to the second linkage gear;
a second support seat, wherein the second support seat is fixedly connected to a side of the first main mid-frame, and provided with a second through hole; and
a second shaft pin, wherein the second shaft pin is rotatably connected in the second through hole, and coaxial with and fixedly connected to the first drive gear and the second drive gear.

* * * * *